(12) United States Patent
Eto

(10) Patent No.: US 6,573,698 B2
(45) Date of Patent: Jun. 3, 2003

(54) CLOCK SYNCHRONIZING METHOD AND CIRCUIT VARYING A PHASE OF A SYNCHRONOUS CLOCK IN ONE DIRECTION OR THE OTHER ACCORDING TO A PHASE DIFFERENCE OF THE SYNCHRONOUS CLOCK FROM A REFERENCE CLOCK

(75) Inventor: Satoshi Eto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 21 days.

(21) Appl. No.: 09/929,355

(22) Filed: Aug. 15, 2001

(65) Prior Publication Data

US 2002/0027430 A1 Mar. 7, 2002

(30) Foreign Application Priority Data

Sep. 1, 2000 (JP) ........................................ 2000-266035

(51) Int. Cl.$^7$ ............................................... G01R 23/12
(52) U.S. Cl. ..................................... 324/76.52; 327/156
(58) Field of Search ........................... 324/76.53, 76.52; 331/17–25; 327/156, 157–159, 160–163, 141, 136, 137; 375/375, 376, 371, 373, 354

(56) References Cited

U.S. PATENT DOCUMENTS

| 5,079,519 A | * | 1/1992 | Ashby et al. ................ 331/1 A |
| 6,340,904 B1 | * | 1/2002 | Manning ..................... 327/156 |
| 6,392,496 B1 | * | 5/2002 | Lee et al. ..................... 331/17 |

* cited by examiner

Primary Examiner—N. Le
Assistant Examiner—Amy He
(74) Attorney, Agent, or Firm—Arent Fox Kintner Plotkin & Kahn

(57) ABSTRACT

A clock synchronizing method is provided. The clock synchronizing method includes the step of detecting a phase difference of a synchronous clock from a reference clock, and the step of varying a phase of the synchronous clock in one direction when the phase difference is not within a predetermined range, and varying the phase of the synchronous clock in one of the one direction and the other direction according to the phase difference when the phase difference is within the predetermined range.

14 Claims, 10 Drawing Sheets

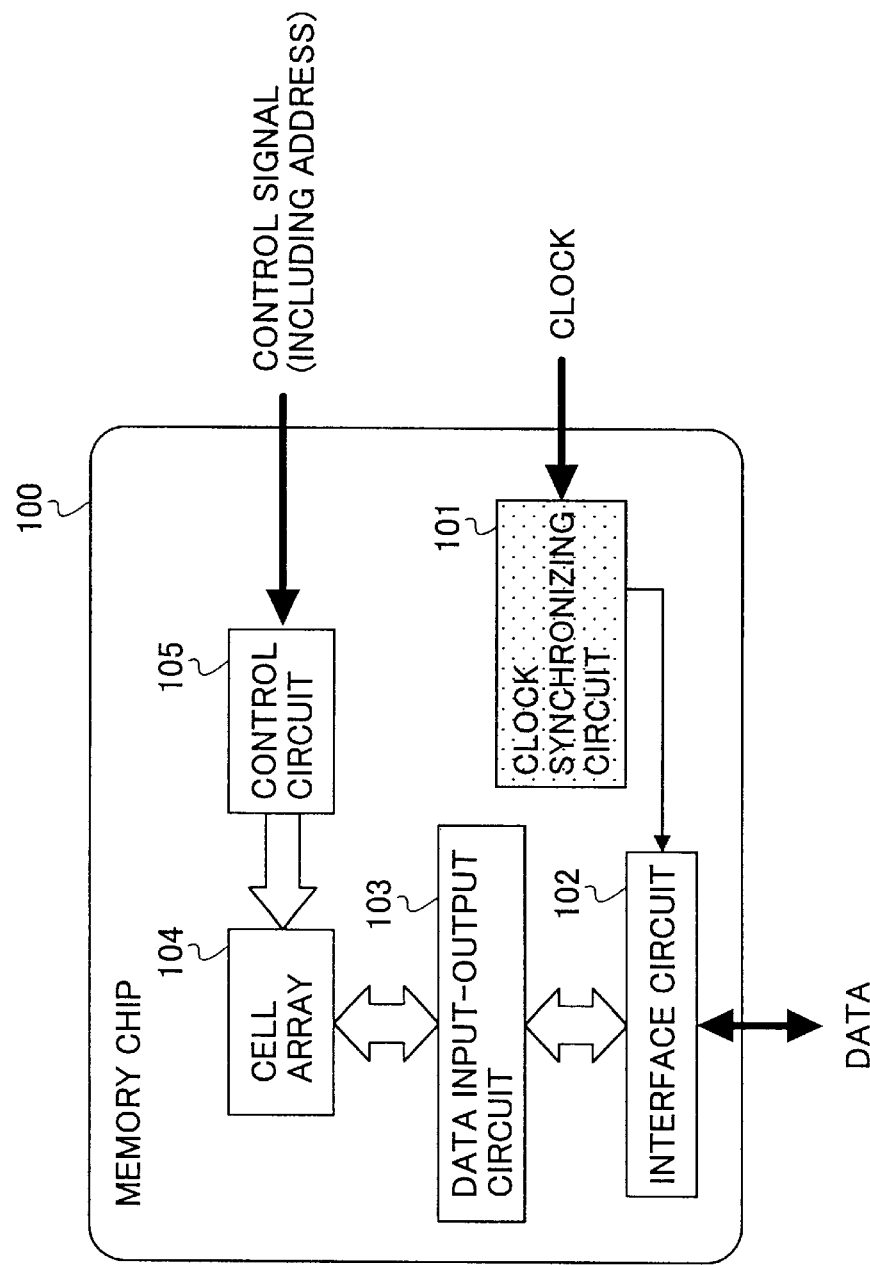

CLOCK SYNCHRONIZING METHOD AND CIRCUIT VARYING A PHASE OF A SYNCHRONOUS CLOCK IN ONE DIRECTION OR THE OTHER ACCORDING TO A PHASE DIFFERENCE OF THE SYNCHRONOUS CLOCK FROM A REFERENCE CLOCK

BACKGROUND OF THE INVENTION

1. Field of the Invention

The present invention generally relates to a clock synchronizing method, a clock synchronizing circuit, and a semiconductor device using the clock synchronizing circuit, and more particularly, to a clock synchronizing method, a clock synchronizing circuit, and a semiconductor device using the clock synchronizing circuit which method and circuit adjust the phase of a clock into a predetermined relation to a reference clock.

2. Description of the Related Art

Recently, a semiconductor device has been required to operate in synchronization with a high-speed clock (for example, at hundreds MHz). Therefore, a semiconductor device is preferably provided with such a clock synchronizing circuit as a PLL (Phase Locked Loop) circuit and a DLL (Delay Locked Loop) circuit.

The DLL circuit adjusts the phase of a clock by delaying the clock properly so as to generate a clock having a predetermined phase with respect to a reference clock. A delay circuit that delays the clock has characteristics that a cutoff frequency is decreased and a noise property is deteriorated as the delay time thereof is increased. Consequently, the DLL circuit adjusts the delay time from small to large so as to make the delay time as small as possible.

In controlling a delay circuit like this, in order to generate a clock (hereinafter referred to as a synchronous clock) having a predetermined phase with respect to a reference clock, an advancement or delay of the synchronous clock with respect to a reference clock is detected so as to control the delay time according to the detection result. However, in a case of making the delay time small immediately after the DLL circuit starts to operate, the delay time cannot be adjusted from small to large.

Thereupon, as shown in FIG. 1, a conventional DLL circuit adjusts the delay time from small to large by dividing the frequencies of a reference clock and a synchronous clock. FIG. 1 is a timing diagram as an example explaining operations of the conventional DLL circuit.

FIG. 1-(A) indicates the reference clock (Ref.CLK). FIG. 1-(B) indicates the synchronous clock (Int.CLK). Before dividing the frequencies of the reference clock and the synchronous clock, it is not clear which edge in FIG. 1-(B) corresponds to an edge A in FIG. 1-(A). Thereupon, in order to clarify the correspondence between an edge of the reference clock and an edge of the synchronous clock, the frequency of the reference clock indicated by FIG. 1-(A) is divided by 4:2 so as to generate a frequency-divided clock indicated by FIG. 1-(C), the frequency-divided clock indicated by FIG. 1-(C) is inverted so as to generate an inverted clock indicated by FIG. 1-(D), and the frequency of the synchronous clock indicated by FIG. 1-(B) is divided by 2:2 so as to generate a frequency-divided clock indicated by FIG. 1-(E).

For example, an edge in FIG. 1-(D) and an edge in FIG. 1-(E) found in an ellipse 1 may be adjusted to each other, and the phase of an edge 4 of the synchronous clock indicated by FIG. 1-(B) is controlled with respect to an edge B of the reference clock indicated by FIG. 1-(A). In other words, an edge of the synchronous clock is controlled to coincide with an edge of the reference clock N periods behind so that the delay time is adjusted from small to large.

By the way, a DLL circuit is required to operate within a predetermined range of clock periods. For example, when the minimum delay time of a delay circuit is tmin, the maximum delay time thereof is tmax, the minimum period of the reference clock is Tmin, the maximum period thereof is Tmax, and the number of clocks between the edge A and the edge B is N, these values have the following relationships represented by expressions (1) and (2).

$$N = \mod(tmin/Tmin) \qquad (1)$$

$$tmax > N \times Tmax - tmin \qquad (2)$$

From these expressions, it is understood that the maximum delay time tmax becomes large depending on N. The maximum delay time tmax of the delay circuit becoming large means an increase in the circuit scale, causing a problem of an increased area occupied by the delay circuit and the DLL circuit (a clock synchronizing circuit). On the contrary, since a circuit scale is expected to decrease for the sake of costs, an area occupied by the clock synchronizing circuit has to be restricted as small as possible.

SUMMARY OF THE INVENTION

It is a general object of the present invention to provide an improved and useful clock synchronizing method, a clock synchronizing circuit, and a semiconductor device using the clock synchronizing circuit in which the above-mentioned problems are eliminated.

A more specific object of the present invention is to provide a clock synchronizing method, a clock synchronizing circuit, and a semiconductor device using the clock synchronizing circuit which method and circuit can adjust the phase of a clock into a predetermined relation to a reference clock by using a small delay time.

In order to achieve the above-mentioned objects, there is provided according to one aspect of the present invention a clock synchronizing method comprising the steps of:

detecting a phase difference of a synchronous clock from a reference clock; and varying a phase of the synchronous clock in one direction when the phase difference is not within a predetermined range, and varying the phase of the synchronous clock in one of the one direction and the other direction according to the phase difference when the phase difference is within the predetermined range.

Additionally, in the clock synchronizing method according to the present invention, the step of detecting may include:

a first step of judging whether or not the phase difference is within the predetermined range; and a second step of judging whether the phase of the synchronous clock is ahead of or behind a phase of the reference clock.

Additionally, in the clock synchronizing method according to the present invention, the step of varying may vary the phase of the synchronous clock in a direction that delays the phase of the synchronous clock when the phase difference is within the predetermined range and the phase of the synchronous clock is ahead of a phase of the reference clock, and may vary the phase of the synchronous clock in a direction that advances the phase of the synchronous clock when the phase difference is within the predetermined range and the phase of the synchronous clock is behind the phase of the reference clock.

According to the present invention, by judging whether or not the phase difference of the synchronous clock from the reference clock is within the predetermined range so as to adjust the direction in which to vary the synchronous clock according to the judgment result, the phase of the synchronous clock can be varied in one direction until the phase difference comes within the predetermined range, and the phase of the synchronous clock can be varied in the one direction or the other according to the phase difference after the phase difference comes within the predetermined range. Therefore, the maximum delay time of a delay circuit can be reduced, and accordingly an area occupied by a clock synchronizing circuit can be decreased.

Additionally, in the clock synchronizing method according to the present invention, the step of varying may vary the phase of the synchronous clock at a first time interval in the one direction when the phase difference is not within a predetermined range, and varies the phase of the synchronous clock at a second time interval in one of the one direction and the other direction according to the phase difference when the phase difference is within the predetermined range.

According to the present invention, by differentiating the time interval at which to vary the phase of the synchronous clock depending on whether or not the phase difference of the synchronous clock from the reference clock is within the predetermined range, the time interval at which to vary the phase of the synchronous clock can be made small when the phase difference is not within the predetermined range, i.e., when the phase difference is large. On the other hand, the time interval at which to vary the phase of the synchronous clock can be made large when the phase difference is within the predetermined range, i.e., when the phase difference is small.

Therefore, while the phase difference of the synchronous clock from the reference clock is large, the time interval at which to vary the phase of the synchronous clock can be made small so as to decrease the phase difference in a short time. On the other hand, after the phase difference becomes small, the time interval at which to vary the phase of the synchronous clock can be made large so as to reduce the amount of electric power being consumed.

Additionally, the clock synchronizing method according to the present invention may further comprise the step of commencing the step of detecting, a predetermined time after a control signal controlling an activation and a deactivation is supplied and the control signal indicates the activation.

According to the present invention, the step of detecting is commenced a predetermined time after a control signal controlling an activation and a deactivation is supplied and the control signal indicates the activation; thereby, the phase difference can be detected and the phase of the synchronous clock can be adjusted, after the synchronous clock becomes stable.

In order to achieve the above-mentioned objects, there is also provided according to another aspect of the present invention a clock synchronizing circuit comprising:

a phase detector detecting a phase difference of a synchronous clock from a reference clock; and a phase adjuster varying a phase of the synchronous clock in one direction when the phase difference is not within a predetermined range, and varying the phase of the synchronous clock in one of the one direction and the other direction according to the phase difference when the phase difference is within the predetermined range.

Additionally, in the clock synchronizing circuit according to the present invention, the phase detector may include:

a first judging unit judging whether or not the phase difference is within the predetermined range; and a second judging unit judging whether the phase of the synchronous clock is ahead of or behind a phase of the reference clock.

Additionally, in the clock synchronizing circuit according to the present invention, the phase adjuster may vary the phase of the synchronous clock in a direction that delays the phase of the synchronous clock when the phase difference is within the predetermined range and the phase of the synchronous clock is ahead of a phase of the reference clock, and may vary the phase of the synchronous clock in a direction that advances the phase of the synchronous clock when the phase difference is within the predetermined range and the phase of the synchronous clock is behind the phase of the reference clock.

According to the present invention, it is judged whether or not the phase difference of the synchronous clock from the reference clock is within the predetermined range so as to adjust the direction in which to vary the synchronous clock according to the judgment result; thereby, the phase of the synchronous clock can be varied in one direction until the phase difference comes within the predetermined range, and the phase of the synchronous clock can be varied in the one direction or the other according to the phase difference after the phase difference comes within the predetermined range. Therefore, the maximum delay time of a delay circuit can be reduced, and consequently an area occupied by the clock synchronizing circuit can be decreased.

Additionally, the clock synchronizing circuit according to the present invention may further comprise a clock generator controlling the phase adjuster to vary the phase of the synchronous clock at a first time interval in the one direction when the phase difference is not within a predetermined range, and to vary the phase of the synchronous clock at a second time interval in one of the one direction and the other direction according to the phase difference when the phase difference is within the predetermined range.

According to the present invention, the time interval at which to vary the phase of the synchronous clock is differentiated depending on whether or not the phase difference of the synchronous clock from the reference clock is within the predetermined range. Thereby, the time interval at which to vary the phase of the synchronous clock can be made small when the phase difference is not within the predetermined range, i.e., when the phase difference is large. On the other hand, the time interval at which to vary the phase of the synchronous clock can be made large when the phase difference is within the predetermined range, i.e., when the phase difference is small.

Therefore, while the phase difference of the synchronous clock from the reference clock is large, the time interval at which to vary the phase of the synchronous clock can be made small so as to decrease the phase difference in a short time. On the other hand, after the phase difference becomes small, the time interval at which to vary the phase of the synchronous clock can be made large so as to reduce the amount of electric power being consumed.

Additionally, the clock synchronizing circuit according to the present invention may further comprise an activator activating the phase detector and the phase adjuster a predetermined time after a control signal controlling an activation and a deactivation of the clock synchronizing circuit is supplied to the activator and the control signal indicates the activation.

According to the present invention, the phase detector and the phase adjuster are activated a predetermined time after a control signal controlling an activation and a deactivation of the clock synchronizing circuit is supplied and the control signal indicates the activation; thereby, the phase difference can be detected and the phase of the synchronous clock can be adjusted, after the synchronous clock becomes stable.

In order to achieve the above-mentioned objects, there is also provided according to still another aspect of the present invention a semiconductor device comprising:

a clock synchronizing circuit including:
a phase detector detecting a phase difference of a synchronous clock from a reference clock; and
a phase adjuster varying a phase of the synchronous clock in one direction when the phase difference is not within a predetermined range, and varying the phase of the synchronous clock in one of the one direction and the other direction according to the phase difference when the phase difference is within the predetermined range.

According to the present invention, it is judged whether or not the phase difference of the synchronous clock from the reference clock is within the predetermined range so as to adjust the direction in which to vary the synchronous clock according to the judgment result; thereby, the phase of the synchronous clock can be varied in one direction until the phase difference comes within the predetermined range, and the phase of the synchronous clock can be varied in the one direction or the other according to the phase difference after the phase difference comes within the predetermined range. Therefore, a semiconductor device can be provided, in which the maximum delay time of a delay circuit can be reduced and accordingly an area occupied by the clock synchronizing circuit can be decreased.

Other objects, features and advantages of the present invention will become more apparent from the following detailed description when read in conjunction with the accompanying drawings.

BRIEF DESCRIPTION OF THE DRAWINGS

FIG. 10 illustrates a semiconductor device as an embodiment using a clock synchronizing circuit according to the present invention.

DETAILED DESCRIPTION OF THE PREFERRED EMBODIMENTS

Figure 1:
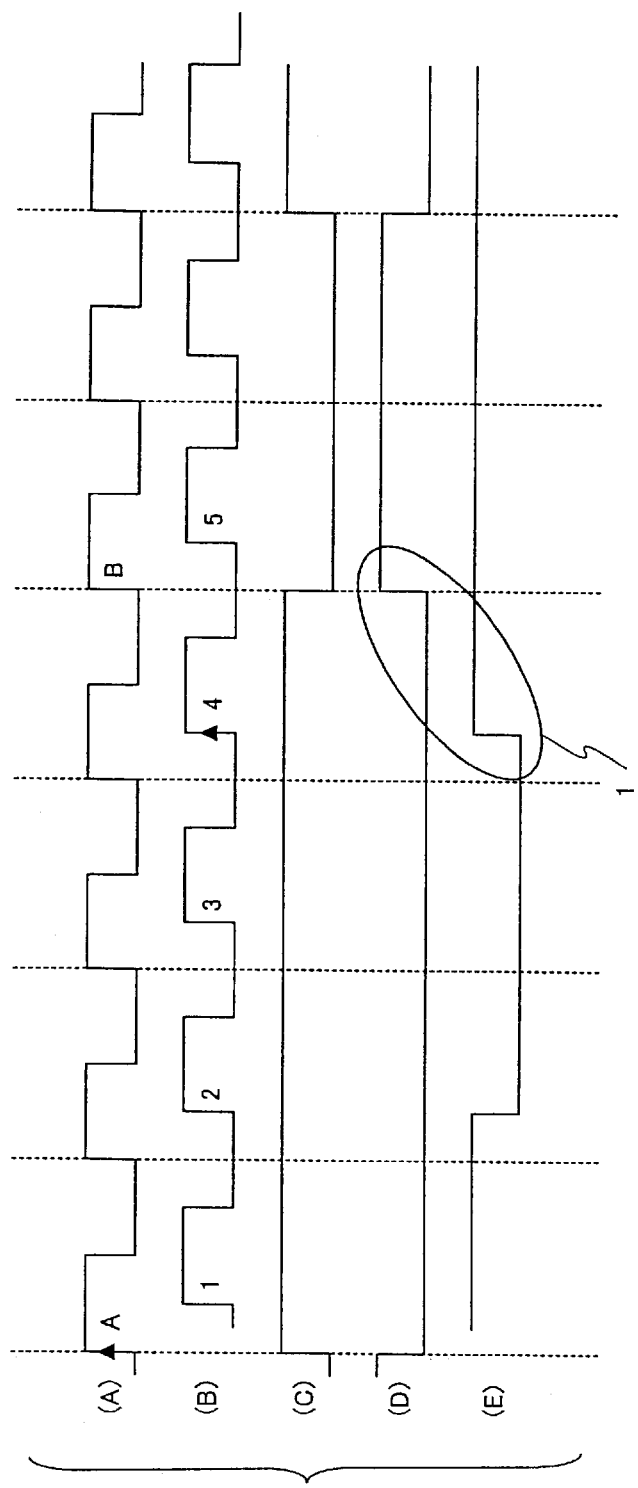
FIG. 1 is a timing diagram as an example explaining operations of a conventional DLL circuit.
Figure 2:
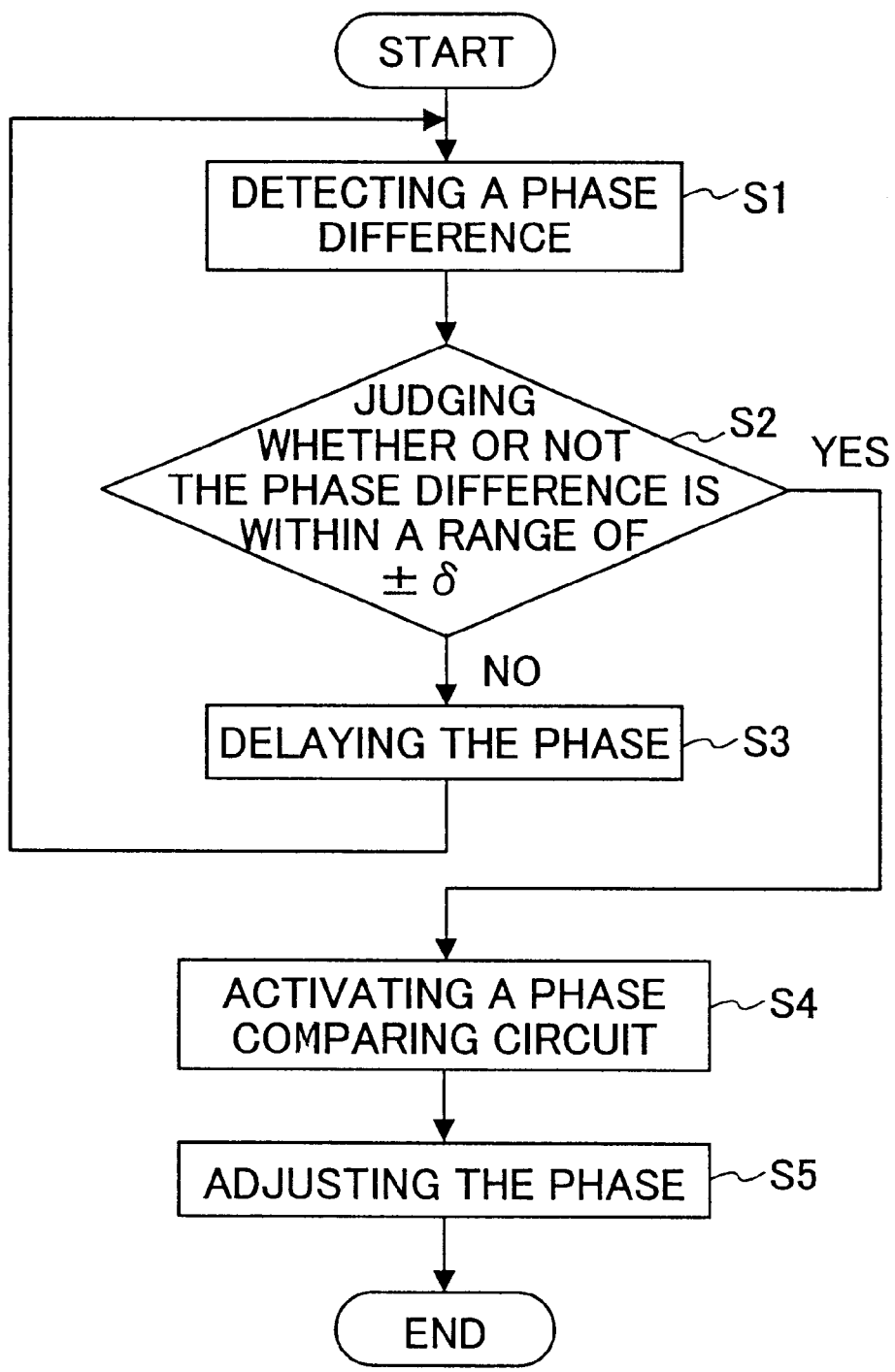
FIG. 2 is a flowchart as an example explaining a principle of the present invention.
Figure 3:
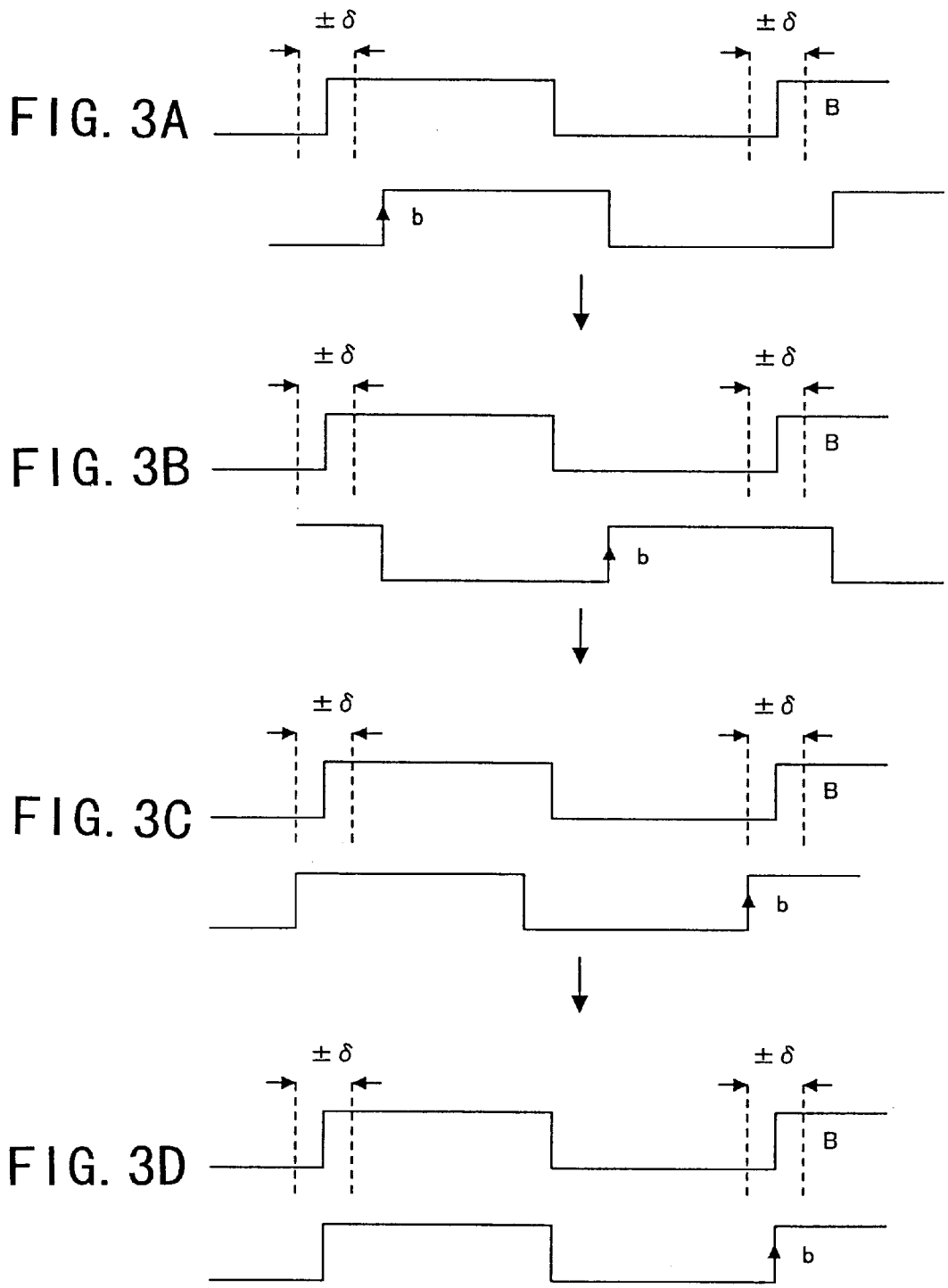
FIG. 3A to FIG. 3D are timing diagrams as an example explaining the principle of the present invention.

Descriptions will now be given, with reference to the drawings, of embodiments according to the present invention. First, in order to make it easy to understand the present invention, a description will be given, with reference to FIG. 2 and FIG. 3, of a principle of the present invention. FIG. 2 is a flowchart as an example explaining the principle of the present invention. FIG. 3A to FIG. 3D are timing diagrams as an example explaining the principle of the present invention. FIG. 3A to FIG. 3D each indicate a reference clock on the upper side, and a synchronous clock on the lower side.

When a phase comparison operation is started, a phase difference of a synchronous clock with respect to a reference clock is detected in a step S1. In a step S2 following the step S1, it is judged whether or not the phase difference detected in the step S1 is within a predetermined range of ±δ. When the phase difference is judged not to be within the predetermined range of ±δ (NO in S2), a step S3 is performed next, in which the phase of the synchronous clock is properly delayed.

For example, in a case of FIG. 3A, an edge b of the synchronous clock is to be adjusted to an edge B of the reference clock, the edge B being next behind. Since the phase difference of the edge b of the synchronous clock from the edge B of the reference clock is not within the predetermined range of ±δ, the phase of the synchronous clock is delayed as shown in FIG. 3B. Then, the step S1 is performed after the step S3, and subsequently, the step S1 to the step S3 are repeated until the phase difference detected in the step S1 is within the predetermined range of ±δ.

When the phase difference is judged to be within the predetermined range of ±δ (YES in S2), a step S4 is performed next, in which a phase-comparing circuit, which will be described hereinafter, is activated. For example, in FIG. 3C, the phase difference of the edge b of the synchronous clock from the edge B of the reference clock is within the predetermined range of ±δ.

After the step S4, a step S5 is performed, in which the phase-comparing circuit judges whether the phase of the edge b of the synchronous clock is behind or ahead of the edge B of the reference clock. This judgment is performed successively; when the phase of the edge b of the synchronous clock is behind the edge B of the reference clock, the phase of the synchronous clock is advanced; when the phase of the edge b of the synchronous clock is ahead of the edge B of the reference clock, the phase of the synchronous clock is delayed. Consequently, the phase of the synchronous clock is adjusted to the reference clock, as shown in FIG. 3D.

When a phase adjustment of the reference clock and the synchronous clock is performed as described above, a delay time required in a delay circuit of a clock synchronizing circuit becomes smaller than the maximum period Tmax of the reference clock; therefore, a circuit scale of the clock synchronizing circuit can be reduced.

Figure 4:
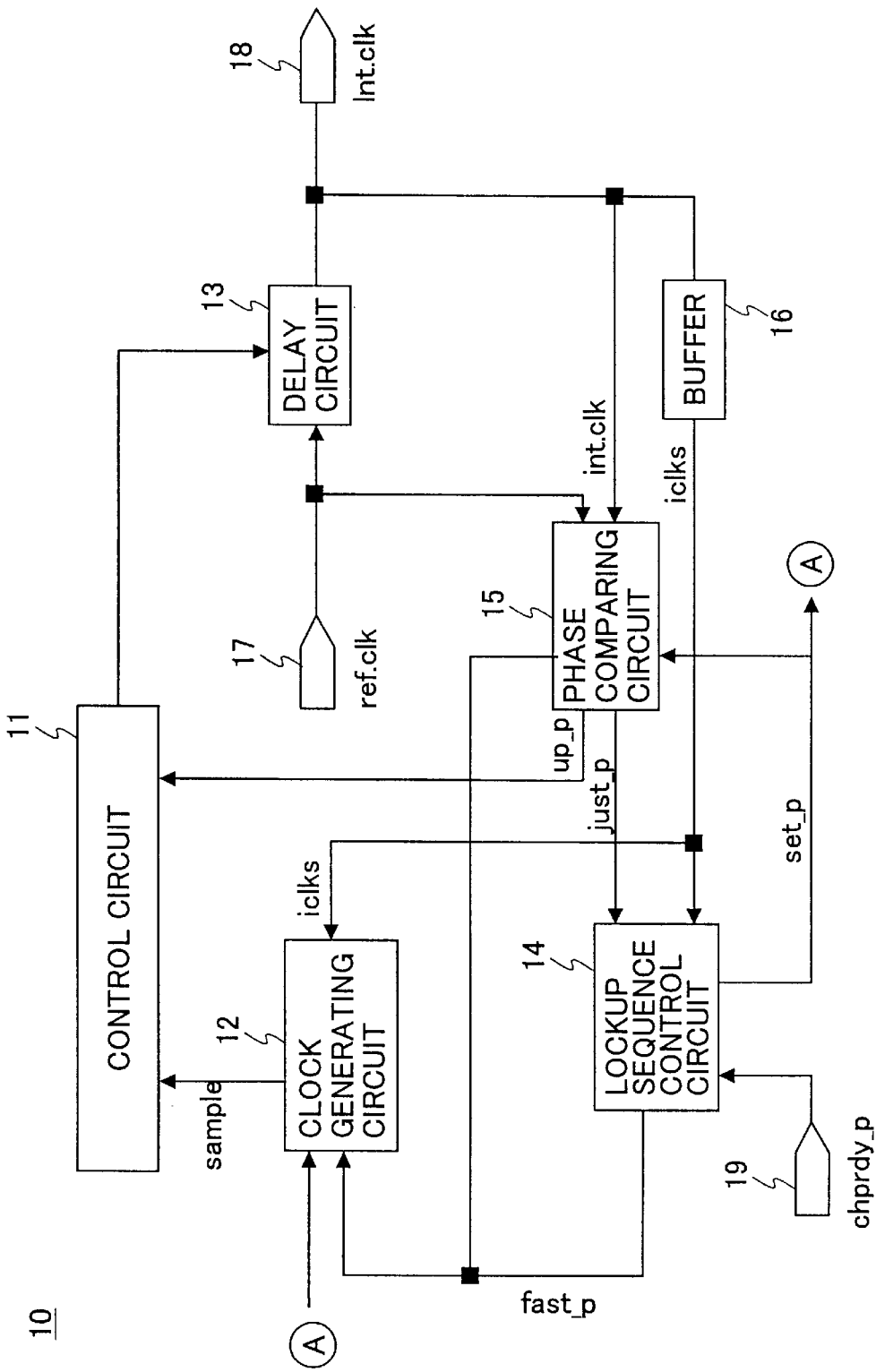
FIG. 4 is a block diagram of an embodiment of a clock synchronizing circuit according to the present invention.

Next, a description will be given, with reference to FIG. 4, of operations of a DLL circuit as an embodiment of a clock synchronizing circuit according to the present invention. It is noted that the clock synchronizing circuit is not limited to this DLL circuit. FIG. 4 is a block diagram of an embodiment of a clock synchronizing circuit 10 according to the present invention. The clock synchronizing circuit 10 comprises a control circuit 11, a clock generating circuit (a clock generator) 12, a delay circuit 13, a lockup sequence control circuit (an activator) 14, a phase comparing circuit (a phase detector) 15, and a buffer 16. (The control circuit 11 and the delay circuit 13 correspond to a phase adjuster.)

A reference clock (ref.clk) is supplied to the delay circuit 13 and the phase comparing circuit 15 via a terminal 17. The delay circuit 13 generates a synchronous clock (int.clk) by delaying the phase of the reference clock, and supplies the synchronous clock to a terminal 18, the phase comparing circuit 15, and the buffer 16. The buffer 16 supplies the synchronous clock to the clock generating circuit 12 and the lockup sequence control circuit 14 as a synchronous clock (iclks). The control circuit 11 controls a delay time of the delay circuit 13.

The phase comparing circuit 15 is supplied with the reference clock and the synchronous clock, and generates a comparison result signal up_p and a judgment result signal just_p. The comparison result signal up_p indicates a result of a phase comparison of the synchronous clock with the reference clock. For example, when the synchronous clock is ahead of the reference clock, the comparison result signal up_p becomes "High", and when the synchronous clock is behind the reference clock, the comparison result signal up_p becomes "Low". The judgment result signal just_p indicates a judgment result of whether or not the phase difference between the reference clock and the synchronous clock is within a predetermined range. For example, when the phase difference is within the predetermined range, the judgment result signal just_p becomes "High", and when the phase difference is not within the predetermined range, the judgment result signal just_p becomes "Low".

A control signal chprdy_p is supplied to the lockup sequence control circuit 14 via a terminal 19. The control signal chprdy_p controls activation/deactivation of a DLL circuit (the clock synchronizing circuit 10). The lockup sequence control circuit 14 supplies a control signal set_p to the phase comparing circuit 15 and the clock generating circuit 12, and also supplies a control signal fast_p to the clock generating circuit 12 and the phase comparing circuit 15.

The control signal fast_p, for example, is "High" before the phase difference of the synchronous clock from the reference clock comes within the predetermined range, and the control signal fast_p is "Low" after the phase difference of the synchronous clock from the reference clock once comes within the predetermined range. The clock generating circuit 12 generates a clock "sample" for controlling the control circuit 11, and supplies the clock "sample" to the control circuit 11.

Figure 5:
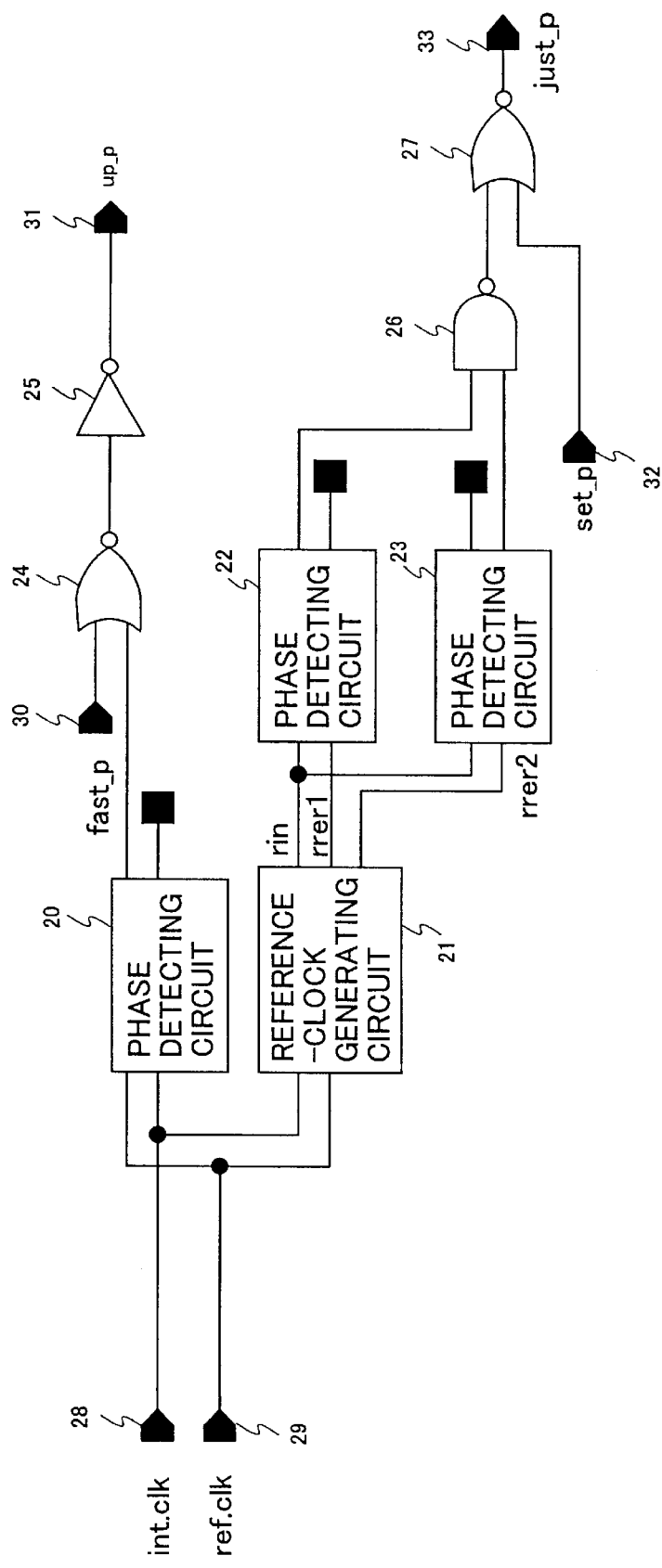
FIG. 5 is a diagram showing a structure of an embodiment of a phase comparing circuit.

Hereinbelow, descriptions will be given in detail of elements constituting the clock synchronizing circuit 10 shown in FIG. 4. FIG. 5 is a diagram showing a structure of an embodiment of the phase comparing circuit 15. The phase comparing circuit 15 comprises phase detecting circuits 20, 22 and 23, a reference-clock generating circuit 21, NOR circuits 24 and 27, a NAND circuit 26, and an inverter circuit 25. (The reference-clock generating circuit 21, the phase detecting circuits 22 and 23, the NAND circuit 26, and the NOR circuit 27 correspond to a first judging unit. The phase detecting circuit 20, the NOR circuit 24, and the inverter circuit 25 correspond to a second judging unit.)

The synchronous clock (int.clk) is supplied to the phase detecting circuit 20 and the reference-clock generating circuit 21 via a terminal 28. The reference clock (ref.clk) is supplied to the phase detecting circuit 20 and the reference-clock generating circuit 21 via a terminal 29. The phase detecting circuit 20 compares rising edges of the synchronous clock and the reference clock, and then supplies the phase comparison result to one terminal of the NOR circuit 24. The phase comparison result output by the phase detecting circuit 20, for example, becomes "High" when the synchronous clock is ahead of the reference clock, and becomes "Low" when the synchronous clock is behind the reference clock.

The control signal fast_p is supplied from the lockup sequence control circuit 14 to the other terminal of the NOR circuit 24 via a terminal 30. The control signal fast_p is "High" before the phase difference of the synchronous clock from the reference clock comes within the predetermined range (hereinbelow referred to as a Fast mode), and the control signal fast_p is "Low" after the phase difference of the synchronous clock from the reference clock once comes within the predetermined range (hereinbelow referred to as a Fine mode). Therefore, the output of the NOR circuit 24 is always "Low" in the Fast mode. On the other hand, in the Fine mode, the output of the NOR circuit 24 corresponds inversely to the phase comparison result supplied from the phase detecting circuit 20. The output of the NOR circuit 24 is output from a terminal 31 via the inverter circuit 25 as the comparison result signal up_p. Thus, the comparison result signal up_p is always "High" in the Fast mode; and, in the Fine mode, the comparison result signal up_p corresponds to the phase comparison result supplied from the phase detecting circuit 20.

The reference-clock generating circuit 21 generates a signal rrer1 by buffering the reference clock supplied thereto, generates a signal rrer2 by delaying the signal rrer1 by 2δ, and generates a signal rin by delaying the synchronous clock supplied thereto by a time required in the above-mentioned buffering plus δ. The reference-clock generating circuit 21 supplies the signal rrer1 and the signal rin to the phase detecting circuit 22, and supplies the signal rrer2 and the signal rin to the phase detecting circuit 23.

The phase detecting circuit 22 compares rising edges of the signal rrer1 and the signal rin, and then supplies the phase comparison result to one terminal of the NAND circuit 26. The phase detecting circuit 23 compares rising edges of the signal rrer2 and the signal rin, and then supplies the phase comparison result to the other terminal of the NAND circuit 26.

The phase comparison result output by the phase detecting circuit 22 becomes "High" when the signal rin is behind the signal rrer1. The phase comparison result output by the phase detecting circuit 23 becomes "High" when the signal rin is ahead of the signal rrer2. Therefore, the output of the NAND circuit 26 becomes "Low" when the signal rin is behind the signal rrer1 and the signal rin is ahead of the signal rrer2. In other words, the output of the NAND circuit 26 is a judgment result of whether or not the rising edge of the synchronous clock is within the predetermined range of ±δ from the rising edge of the reference clock, and becomes "Low" when the rising edge of the synchronous clock is within the predetermined range of ±δ from the rising edge of the reference clock.

The output of the NAND circuit 26 is supplied to one terminal of the NOR circuit 27. The control signal set_p is supplied from the lockup sequence control circuit 14 to the other terminal of the NOR circuit 27 via a terminal 32. Therefore, the output of the NOR circuit 27 is always "Low" when the control signal set_p is "High".

On the other hand, when the control signal set_p is "Low", the output of the NOR circuit 27 corresponds inversely to the judgment result supplied from the NAND circuit 26. The output of the NOR circuit 27 is output from a terminal 33 as the judgment result signal just_p. Accordingly, the judgment result signal just_p is always "Low" when the control signal set_p is "High"; and when the control signal set_p is "Low", the judgment result signal just_p corresponds inversely to the judgment result supplied from the NAND circuit 26, and thus becomes "High" when the rising edge of the synchronous clock is within the predetermined range of ±δ from the rising edge of the reference clock.

Figure 6:
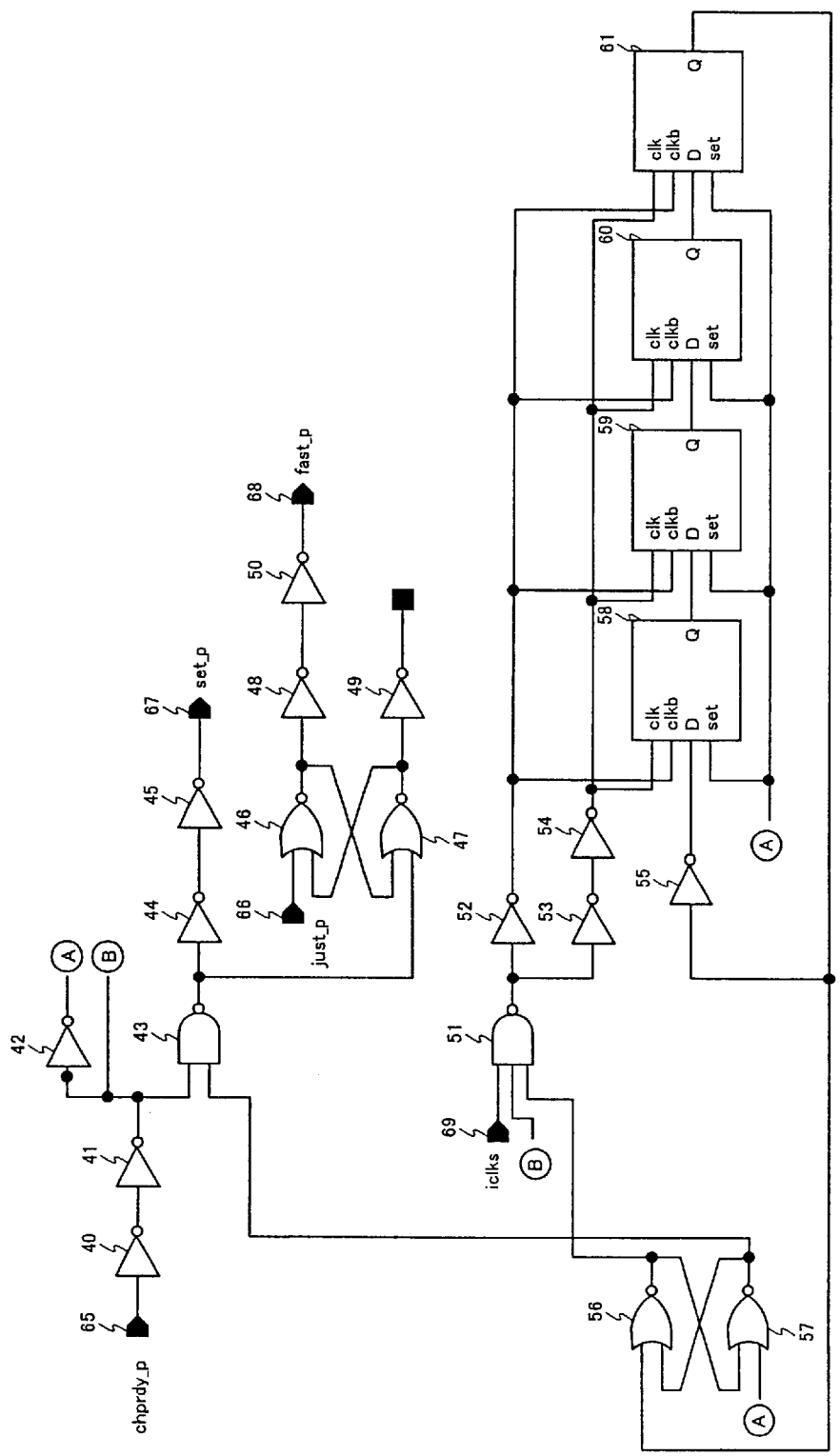
FIG. 6 is a diagram showing a structure of an embodiment of a lockup sequence control circuit.

FIG. 6 is a diagram showing a structure of an embodiment of the lockup sequence control circuit 14. The control signal chprdy_p is supplied by way of a terminal 65. The control signal chprdy_p controls activation/deactivation of a DLL circuit (the clock synchronizing circuit 10), and, for example, becomes "High" in activation and becomes "Low" in deactivation.

The control signal chprdy_p is supplied to a terminal 67 via inverters 40 and 41, a NAND circuit 43, and inverters 44 and 45, and then is output as the control signal set_p. Accordingly, when the control signal chprdy_p becomes "Low", the control signal set_p becomes "High"; when the control signal chprdy_p becomes "High", the control signal set_p becomes "Low".

When the control signal set_p becomes "High", the judgment result signal just_p is "Low", as described with reference to FIG. 5. Accordingly, when the control signal chprdy_p becomes "Low", the judgment result signal just_p supplied via a terminal 66 becomes "Low". The judgment result signal just_p is supplied via the terminal 66, a NOR circuit 46, and inverter circuits 48 and 50 to a terminal 68, and then is output as the control signal fast_p. When the judgment result signal just_p becomes "Low", the control signal fast_p becomes "High". When the judgment result signal just_p becomes "High", the control signal fast_p becomes "Low".

Additionally, the control signal chprdy_p is supplied to a set terminal of each of counter circuits 58 to 61 via the inverters 40 and 41 and an inverter 42. When the control signal chprdy_p becomes "Low", the counter circuits 58 to 61 are reset. When the counter circuits 58 to 61 are reset, an output signal of the counter circuit 61 becomes "Low".

The output signal of the counter circuit 61 is supplied to an inverter circuit 55 and a NOR circuit 56. When the output signal of the counter circuit 61 becomes "Low", an output signal of the NOR circuit 56 becomes "High", and an output signal of a NOR circuit 57 becomes "Low".

Then, when the control signal chprdy_p becomes "High", the reset of the counter circuits 58 to 61 is canceled, and the counter circuits 58 to 61 start counting the synchronous clock supplied via a terminal 69. When the counter circuits 58 to 61 count to a predetermined number (for example, 8), the output signal of the counter circuit 61 becomes "High". When the output signal of the counter circuit 61 becomes "High", the output signal of the NOR circuit 56 becomes "Low", and the output signal of the NOR circuit 57 becomes "High".

The output signal of the NOR circuit 57 is supplied to the NAND circuit 43. When the output signal of the NOR circuit 57 becomes "High", the control signal set_p output from the terminal 67 becomes "Low". When the control signal set_p becomes "Low", the judgment result signal just_p indicates a judgment result of whether or not the phase difference between the reference clock and the synchronous clock is within a predetermined range, as described with reference to FIG. 5. For example, when the phase difference is within the predetermined range, the judgment result signal just_p becomes "High", and when the phase difference is not within the predetermined range, the judgment result signal just_p becomes "Low".

Once the judgment result signal just_p supplied from the terminal 66 becomes "High", an RS flip-flop circuit consisting of the NOR circuit 46 and a NOR circuit 47 supplies the "Low" control signal fast_p to the terminal 68 via the inverter circuits 48 and 50. This RS flip-flop circuit retains the output until the DLL circuit (the clock synchronizing circuit 10) is deactivated.

Figure 7:
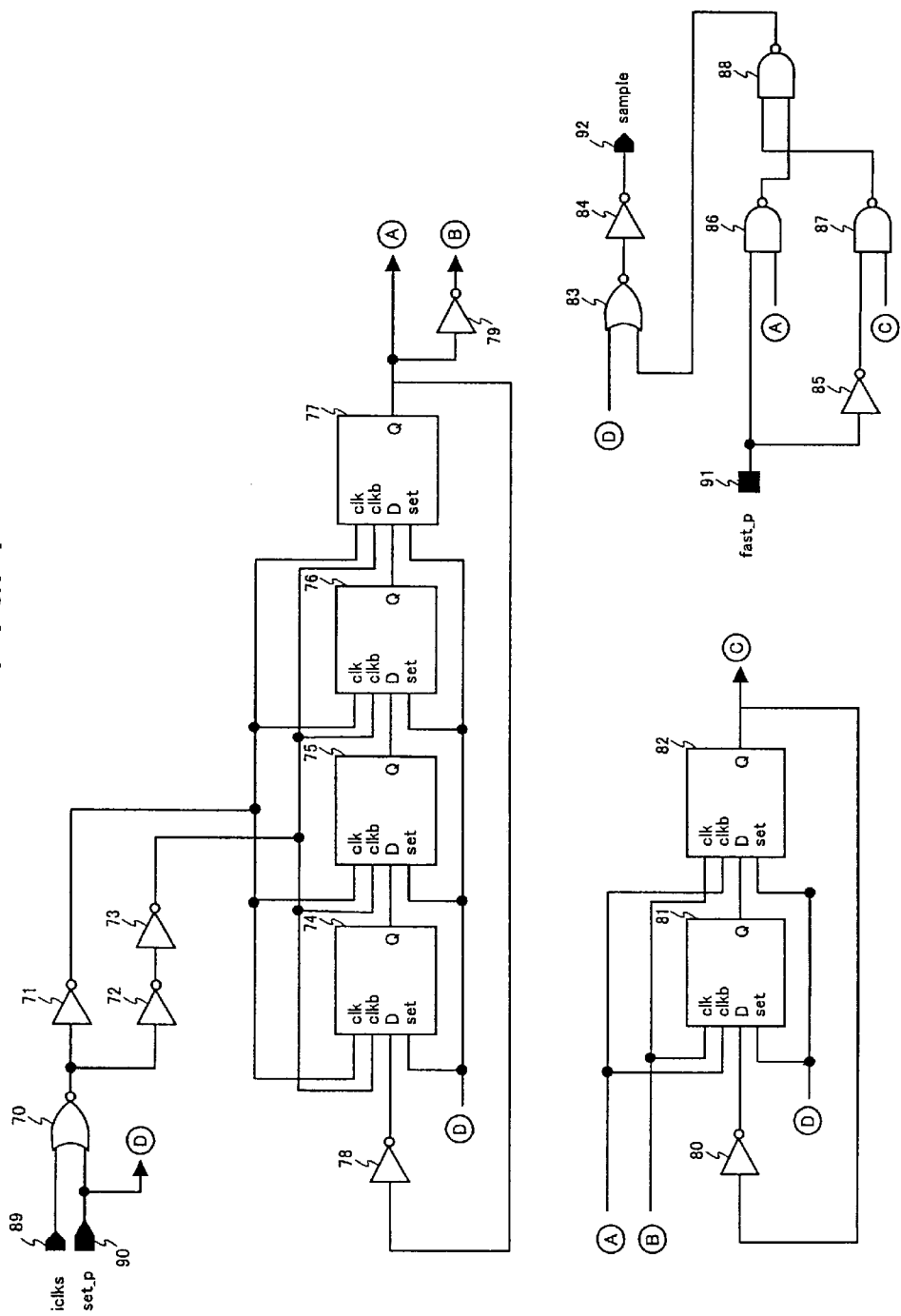
FIG. 7 is a diagram showing a structure of an embodiment of a clock generating circuit.

FIG. 7 is a diagram showing a structure of an embodiment of the clock generating circuit 12. The clock generating circuit 12 generates the sampling clock "sample" used for the control circuit 11 to successively reference the comparison result signal up_p supplied from the phase comparing circuit 15, and supplies the sampling clock "sample" to the control circuit 11.

The control signal set_p is supplied via a terminal 90. The control signal set_p is supplied to a terminal 92 via a NOR circuit 83 and an inverter circuit 84. Accordingly, when the control signal set_p is "High", the sampling clock "sample" becomes "High". On the other hand, when the control signal set_p is "Low", the sampling clock "sample" corresponds to the output of a NAND circuit 88.

The NAND circuit 88 is supplied with the outputs of NAND circuits 86 and 87. One terminal of the NAND circuit 86 is connected to a terminal 91, and the other terminal of the NAND circuit 86 is connected to the output terminal of a counter circuit 77. One terminal of the NAND circuit 87 is connected to the terminal 91 via an inverter circuit 85, and the other terminal of the NAND circuit 87 is connected to the output terminal of a counter circuit 82.

When the control signal set_p becomes "Low", a reset of counter circuits 74 to 76, the counter circuit 77, a counter circuit 81 and the counter circuit 82 is canceled, and the counter circuits 74 to 77 and the counter circuits 81 and 82 start counting the synchronous clock supplied via a terminal 89. It is noted that a clock output from the counter circuit 77 and a clock output from the counter circuit 82 have different frequency division rates.

Either of the clock supplied from the counter circuit 77 to the NAND circuit 86 and the clock supplied from the counter circuit 82 to the NAND circuit 87 is supplied to the NAND circuit 88 according to the control signal fast_p supplied via the terminal 91. For example, when the control signal fast_p is "High", the clock supplied from the counter circuit 77 is supplied to the NAND circuit 88 via the NAND circuit 86. On the other hand, when the control signal fast_p is "Low", the clock supplied from the counter circuit 82 is supplied to the NAND circuit 88 via the NAND circuit 87.

When the control signal fast_p is "High", the phase difference of the synchronous clock from the reference clock is not within the predetermined range. Therefore, the sampling clock "sample" increasing the frequency of referencing the comparison result signal up_p is generated. Accordingly, the sampling clock "sample" increasing the frequency of referencing the comparison result signal up_p is supplied to the control circuit 11 so as to shorten a time it takes for the phase difference to come within the predetermined range.

On the other hand, when the control signal fast_p is "Low", the phase difference of the synchronous clock from the reference clock is within the predetermined range. Therefore, there is no need for the control circuit 11 to reference the comparison result signal up_p as often as when the phase difference is not within the predetermined range. In this case, it is preferable to decrease the frequency of referencing the comparison result signal up_p in consideration of the amount of electric power being consumed. Accordingly, the sampling clock "sample" decreasing the frequency of referencing the comparison result signal up_p is generated.

Figure 8:
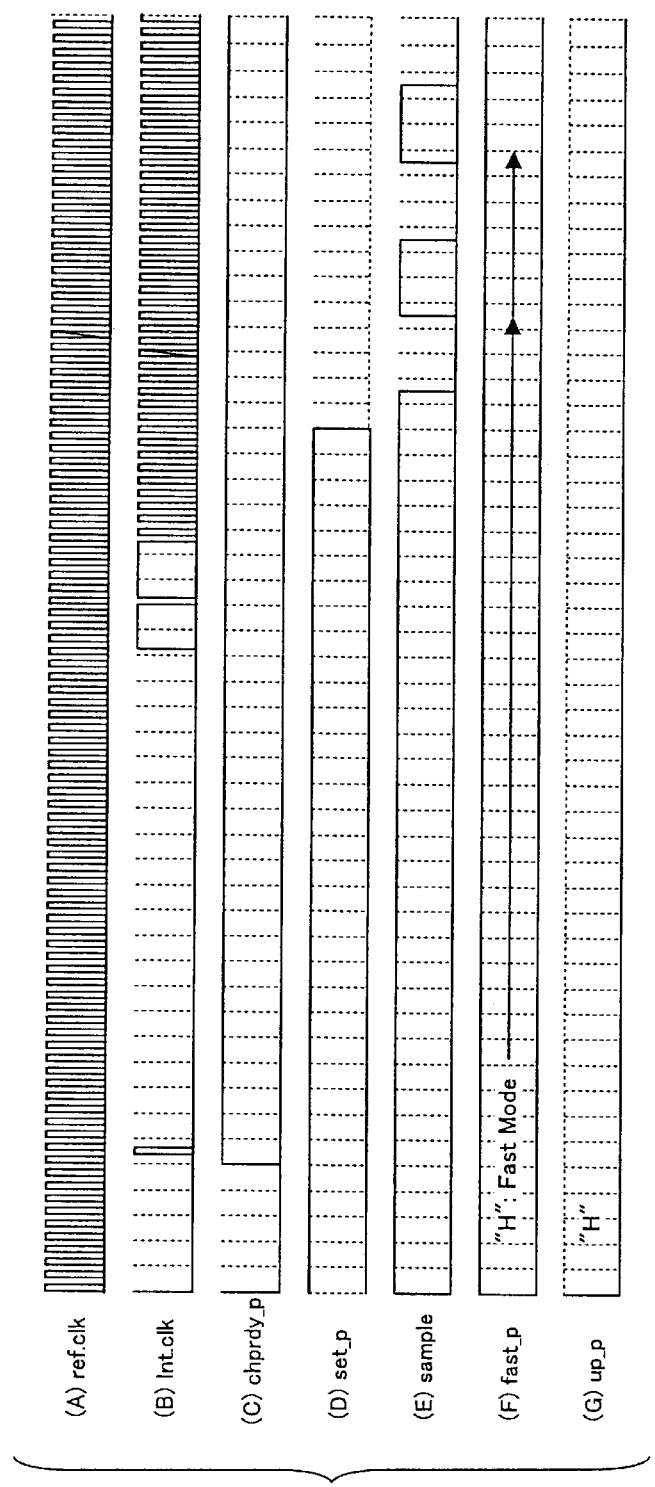
FIG. 8 is a timing diagram as an example immediately after the clock synchronizing circuit is activated.
Figure 9:
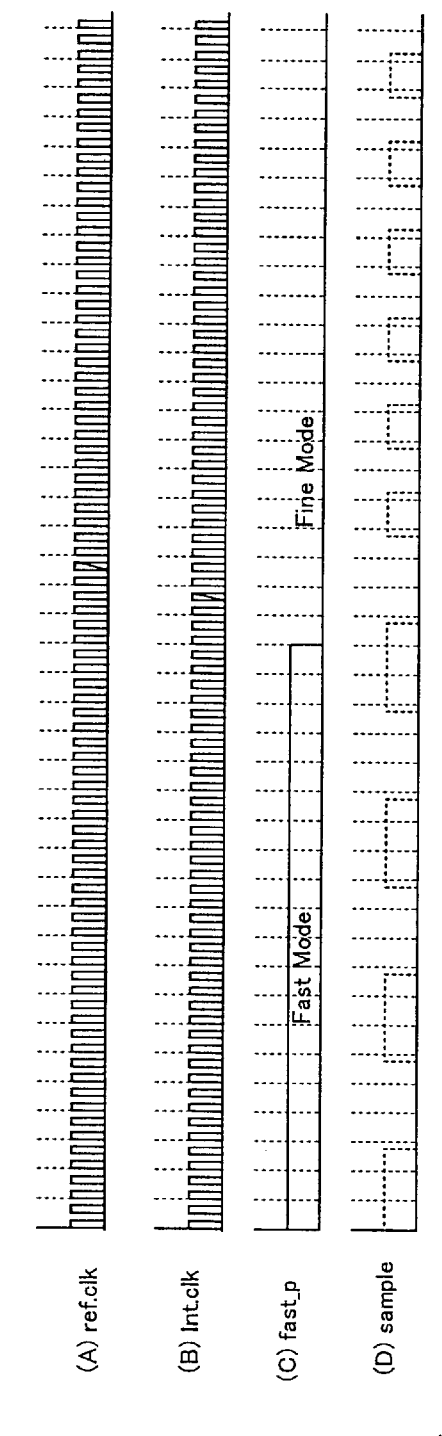
FIG. 9 is a timing diagram as an example showing around the change from a Fast mode to a Fine mode.

Hereinbelow, a description will be given, with reference to FIG. 8 and FIG. 9, of an operational timing of the clock synchronizing circuit 10. FIG. 8 is a timing diagram as an example immediately after the clock synchronizing circuit 10 is activated. FIG. 9 is a timing diagram as an example showing around the change from the Fast mode to the Fine mode.

When the control signal chprdy_p indicated by FIG. 8-(C) changes from "Low" to "High" so as to activate the clock synchronizing circuit 10, the number of the synchronous clock (int.clk) indicated by FIG. 8-(B) passing through the delay circuit 13 is counted in the lockup sequence control circuit 14. When the synchronous clock (int.clk) is counted to a predetermined number, the control signal set_p indicated by FIG. 8-(D) changes from "High" to "Low", and consequently the control signal fast_p indicated by FIG. 8-(F) starts to be output.

The control signal fast_p is "High" before the phase difference between the reference clock (ref.clk) indicated by FIG. 8-(A) and the synchronous clock (int.clk) comes within the predetermined range. Once the phase difference comes within the predetermined range, the control signal fast_p becomes "Low". Besides, the comparison result signal up_p indicated by FIG. 8-(G) is "High" before the control signal fast_p becomes "Low". Therefore, the control circuit 11 controls a delay time of the delay circuit 13 so as to delay the phase of the synchronous clock (int.clk) until the phase difference between the reference clock (ref.clk) and the synchronous clock (int.clk) comes within the predetermined range.

After the control signal fast$_{13}$ p indicated by FIG. 9-(C) becomes "Low", the comparison result signal up_p becomes "High" when the synchronous clock is ahead of the reference clock, and becomes "Low" when the synchronous clock is behind the reference clock. Therefore, the control circuit 11 controls the delay time of the delay circuit 13 so as to delay or advance the phase of the synchronous clock (int.clk) according to the comparison result between the phases of the reference clock (ref.clk) and the synchronous clock (int.clk).

It is noted that the sampling clock "sample" indicated by FIG. 8-(E) and FIG. 9-(D) has different frequencies corresponding to the level of the control signal fast_p. Thus, the cycle of the phase adjustment in the control circuit 11 and the delay circuit 13 can be varied according to whether or not the phase difference between the reference clock (ref.clk) and the synchronous clock is within the predetermined range.

FIG. 10 illustrates a semiconductor device as an embodiment using a clock synchronizing circuit according to the present invention. A semiconductor device 100 shown in FIG. 10 is a memory chip, and comprises a clock synchronizing circuit 101, an interface circuit 102, a data input-output circuit 103, a cell array 104, and a control circuit 105.

The clock synchronizing circuit 101 according to the present invention adjusts the phase of a clock supplied from externally so as to supply an internal clock having the adjusted phase to the interface circuit 102. The interface circuit 102 reads data supplied from externally according to the internal clock supplied from the clock synchronizing circuit 101. In this manner, the clock synchronizing circuit 101 according to the present invention can be adopted in various semiconductor devices.

The present invention is not limited to the specifically disclosed embodiments, and variations and modifications may be made without departing from the scope of the present invention.

The present application is based on Japanese priority application No. 2000-266035 filed on Sep. 1, 2000, the entire contents of which are hereby incorporated by reference.

What is claimed is:

1. A clock synchronizing method comprising the steps of:
   detecting a phase difference of a synchronous clock from a reference clock; and
   varying a phase of said synchronous clock in one direction when said phase difference is not within a predetermined range, and varying the phase of said synchronous clock in one of said one direction and the other direction according to said phase difference when said phase difference is within the predetermined range.

2. The clock synchronizing method as claimed in claim 1, wherein said step of detecting includes:
   a first step of judging whether or not said phase difference is within the predetermined range; and
   a second step of judging whether the phase of said synchronous clock is ahead of or behind a phase of said reference clock.

3. The clock synchronizing method as claimed in claim 1, wherein said step of varying varies the phase of said synchronous clock at a first time interval in said one direction when said phase difference is not within a predetermined range, and varies the phase of said synchronous clock at a second time interval in one of said one direction and the other direction according to said phase difference when said phase difference is within the predetermined range.

4. The clock synchronizing method as claimed in claim 1, further comprising the step of commencing said step of detecting, a predetermined time after a control signal controlling an activation and a deactivation is supplied and said control signal indicates the activation.

5. The clock synchronizing method as claimed in claim 1, wherein said step of varying varies the phase of said synchronous clock in a direction that delays the phase of said synchronous clock when said phase difference is within the predetermined range and the phase of said synchronous clock is ahead of a phase of said reference clock, and varies the phase of said synchronous clock in a direction that advances the phase of said synchronous clock when said phase difference is within the predetermined range and the phase of said synchronous clock is behind the phase of said reference clock.

6. The clock synchronizing method as claimed in claim 1, wherein said predetermined range is larger than a range into which said step of varying varies the phase of said synchronous clock when said phase difference is within said predetermined range, and is smaller than a period of said reference clock.

7. A clock synchronizing circuit comprising:
   a phase detector detecting a phase difference of a synchronous clock from a reference clock; and
   a phase adjuster varying a phase of said synchronous clock in one direction when said phase difference is not within a predetermined range, and varying the phase of said synchronous clock in one of said one direction and the other direction according to said phase difference when said phase difference is within the predetermined range.

8. The clock synchronizing circuit as claimed in claim 7, wherein said phase detector includes:
   a first judging unit judging whether or not said phase difference is within the predetermined range; and
   a second judging unit judging whether the phase of said synchronous clock is ahead of or behind a phase of said reference clock.

9. The clock synchronizing circuit as claimed in claim 7, further comprising a clock generator controlling said phase adjuster to vary the phase of said synchronous clock at a first time interval in said one direction when said phase difference is not within a predetermined range, and to vary the phase of said synchronous clock at a second time interval in one of said one direction and the other direction according to said phase difference when said phase difference is within the predetermined range.

10. The clock synchronizing circuit as claimed in claim 7, further comprising an activator activating said phase detector and said phase adjuster a predetermined time after a control signal controlling an activation and a deactivation of the clock synchronizing circuit is supplied to the activator and said control signal indicates the activation.

11. The clock synchronizing circuit as claimed in claim 7, wherein said phase adjuster varies the phase of said synchronous clock in a direction that delays the phase of said synchronous clock when said phase difference is within the predetermined range and the phase of said synchronous clock is ahead of a phase of said reference clock, and varies the phase of said synchronous clock in a direction that advances the phase of said synchronous clock when said phase difference is within the predetermined range and the phase of said synchronous clock is behind the phase of said reference clock.

12. The clock synchronizing circuit as claimed in claim 7, wherein said predetermined range is larger than a range into which said phase adjuster varies the phase of said synchronous clock when said phase difference is within said predetermined range, and is smaller than a period of said reference clock.

13. A semiconductor device comprising:
   a clock synchronizing circuit including:
      a phase detector detecting a phase difference of a synchronous clock from a reference clock; and
      a phase adjuster varying a phase of said synchronous clock in one direction when said phase difference is not within a predetermined range, and varying the phase of said synchronous clock in one of said one direction and the other direction according to said phase difference when said phase difference is within the predetermined range.

14. The semiconductor device as claimed in claim 13, wherein said predetermined range is larger than a range into which said phase adjuster varies the phase of said synchronous clock when said phase difference is within said predetermined range, and is smaller than a period of said reference clock.

* * * * *